United States Patent [19]

Chi et al.

[11] Patent Number: 5,940,324
[45] Date of Patent: Aug. 17, 1999

[54] SINGLE-POLY EEPROM CELL THAT IS PROGRAMMABLE AND ERASABLE IN A LOW-VOLTAGE ENVIRONMENT

[75] Inventors: Min-Hwa Chi; Albert Bergemont, both of Palo Alto, Calif.

[73] Assignee: National Semiconductor Corporation, Santa Clara, Calif.

[21] Appl. No.: 09/053,284

[22] Filed: Apr. 1, 1998

Related U.S. Application Data

[63] Continuation-in-part of application No. 08/796,616, Feb. 7, 1997, Pat. No. 5,761,126.

[51] Int. Cl.[6] .................................................. G11C 16/04
[52] U.S. Cl. ................ 365/185.27; 365/185.18; 365/185.29; 257/314; 257/319
[58] Field of Search .......................... 365/185.27, 185.18, 365/185.29; 257/314, 319

[56] References Cited

U.S. PATENT DOCUMENTS

| | | | |
|---|---|---|---|
| 5,280,446 | 1/1994 | Ma et al. ............................ | 365/185.15 |
| 5,457,652 | 10/1995 | Brahmbhatt ........................ | 365/185.06 |
| 5,491,657 | 2/1996 | Haddad et al. ..................... | 365/185.27 |
| 5,515,319 | 5/1996 | Smayling et al. .................. | 365/185.27 |
| 5,612,913 | 3/1997 | Cappelletti et al. ............... | 365/185.27 |

OTHER PUBLICATIONS

Ohnakado, T., et al., "Novel Electron Injection Method Using Band–to–Band Tunneling Induced Hot Electron (BBHE) for Flash Memory with a P–channel Cell," IEDM 1995, pp. 279–282.

Chan, T.Y. et al., "The Impact of Gate–Induced Drain Leakage Current on MOSFET Scaling," IEDM, 1987, 4 pages.

Primary Examiner—David C. Nelms
Assistant Examiner—Hoai V. Ho
Attorney, Agent, or Firm—Limbach & Limbach L.L.P.

[57] ABSTRACT

A single-poly EPROM cell, which has spaced-apart regions of opposite conductivity formed in the base region and a thin layer of tunnel oxide, is formed in a triple-well CMOS-compatible process. By utilizing a triple-well structure and a thin layer of tunnel oxide, the cell of the present invention is both electrically programmable and erasable in a low-voltage, i.e., +3.3V environment.

17 Claims, 8 Drawing Sheets

SINGLE-POLY EEPROM CELL THAT IS PROGRAMMABLE AND ERASABLE IN A LOW-VOLTAGE ENVIRONMENT

RELATED APPLICATIONS

The present application is a continuation-in-part of application Ser. No. 08/796,616, U.S. Pat. No. 5,761,126 filed Feb. 7, 1997 by Min-hwa Chi et al. for Single-Poly EPROM Cell that Utilizes a Reduced Programming Voltage to Program the Cell.

The present application is also related to application Ser. No. 09/053,199 filed on even date herewith by Richard B. Merrill et al. for Single-Poly EPROM Cell Having Smaller Size and Improved Data Retention Compatible With Advanced CMOS Process.

BACKGROUND OF THE INVENTION

1. Field of the Invention

The present invention relates to a single-poly electrically-erasable programmable read-only-memory (EEPROM) cell and, more particularly, to a single-poly EEPROM cell that is programmable and erasable in a low-voltage environment.

2. Description of the Related Art

A single-poly electrically-programmable read-only-memory (EPROM) cell is a non-volatile storage device which is fabricated using process steps that are fully compatible with conventional single-poly CMOS fabrication process steps. As a result, single-poly EPROM cells are often embedded in CMOS logic and mixed-signal circuits.

FIGS. 1A–1C show a series of views that illustrate a conventional single-poly EPROM cell 100. FIG. 1A shows a plan view of cell 100, FIG. 1B shows a cross-sectional view taken along line 1B—1B of FIG. 1A, while FIG. 1C shows a cross-sectional view taken along line 1C—1C of FIG. 1A.

As shown in FIGS. 1A–1C, EPROM cell 100 includes spaced-apart source and drain regions 114 and 116, respectively, which are formed in a p-type semiconductor material 112, such as a well or a substrate, and a channel region 118 which is defined between source and drain regions 114 and 116.

As further shown in FIGS. 1A–1C, cell 100 also includes an n-well 120 which is formed in p-type material 112, and a field oxide region FOX which is formed in p-type material 112 to isolate source region 114, drain region 116, and channel region 118 from n-well 120.

In addition, cell 100 further includes adjoining p+ and n+ contact regions 122 and 124, respectively, which are formed in n-well 120. Current generation cells also include a p-type lightly-doped-drain (PLDD) region 126 which adjoins p+ contact region 122.

Further, a control gate region 128 is defined between PLDD region 126 and the field oxide region FOX that isolates n-well 120 from source region 114, drain region 116, and channel region 118. In addition, a layer of gate oxide 130 is formed over channel region 118, a layer of control gate oxide 132 is formed over control gate region 128, and a floating gate 134 is formed over gate oxide layer 130, control gate oxide layer 132, and a portion of the field oxide region FOX.

During the fabrication of cell 100, gate oxide layer 130 and control gate oxide layer 132 are typically grown at the same time and, as a result, have substantially the same thickness, e.g. approximately 120 Å for 0.5 micron technology, and 70 Å for 0.35 micron technology.

In operation, cell 100 is programmed by applying approximately 12 volts to contact regions 122 and 124, which are shorted together, and approximately 6–7 volts to drain region 116. In addition, both p-type material 112 and source region 114 are grounded.

When the positive voltage is applied to contacts 122 and 124, a positive potential is induced on floating gate 134. Specifically, the positive voltage applied to n+ contact region 124 in conjunction with the potential of floating gate 134 forms a deep depletion region at the surface of control gate region 128 which, in turn, reduces the potential at the surface of control gate region 128.

The positive voltage applied to p+ contact region 122 slightly forward-biases the p+ contact region to n-well junction at the surface of control gate region 128. As a result, holes are injected into the surface region of control gate region 128, thereby inverting the surface of control gate region 128.

The injected holes quickly (in picoseconds) reduce the depth of the depletion region at the surface of control gate region 128 which, in turn, places substantially all of the voltage applied to contact region 124 across control gate oxide layer 132. As a result, the initial potential induced on floating gate 134 is defined by the voltage applied to contact regions 122 and 124, and the thickness of control gate oxide layer 132 (which defines the coupling ratio between n-well 120 and floating gate 134).

Without the presence of p+ contact region 122, few holes would accumulate at the surface of control gate region 128 when the surface is initially depleted because n-well 120 contains relatively few holes. Thus, the depth of the depletion region can only be slowly reduced in size as thermally-generated holes drift up to the surface of control gate region 128.

Since the depth of the depletion region is initially large, the initial potential induced on floating gate 134 is substantially less because the voltage applied to contact 124 is placed across both control gate oxide layer 132 and a relatively large depletion region. Thus, p+ region 122 provides a method for quickly reducing the depth of the depletion region after the surface of control gate region 128 is depleted which, in turn, increases the potential initially induced on floating gate 134.

As noted above, current generation cells also require the use of PLDD region 126. As is well known, the thickness of control gate oxide layer 132 at the edge of the layer which is adjacent to p+ contact region 122 is slightly thicker than the central portion of the layer due to the well-known process step of re-oxidation after the poly gate has been etched. As a result, the depletion region formed at the edge is too small to sufficiently invert the surface which, in turn, limits the ability of p+ contact region 122 to inject holes into the surface of control gate region 128.

Thus, current generation cells utilize PLDD region 126 to form a hole injection region that adjoins the surface region of control gate region 128 away from the edge. Previous generation cells did not require a PLDD region because the thermal steps used during the fabrication of these cells allowed sufficient lateral diffusion of p+ contact region 122.

Returning again to the operation of cell 100, the positive potential induced on floating gate 134 from the application of a positive voltage to contact regions 122 and 124 forms a depletion region in channel region 118 which increases the potential at the surface of channel region 118. Source region 114 then injects electrons into the surface of channel region 118 which, in turn, forms a channel of mobile electrons.

The positive voltage applied to drain region 116 sets up an electric field between source and drain regions 114 and 116 which then accelerates the electrons in the channel. The accelerated electrons then have ionizing collisions that form "channel hot electrons". The positive potential of floating gate 134 attracts these channel hot electrons which penetrate gate oxide layer 130 and begin accumulating on floating gate 134, thereby raising the threshold voltage of cell 100.

Cell 100 is read by applying approximately 5 volts to contact regions 122 and 124, and approximately 1–2 volts to drain region 116. In addition, both p-type material 112 and source region 114 are grounded.

Under these bias conditions, a positive potential is induced on floating gate 134 by the above-described mechanism which is sufficient, i.e., larger than the threshold voltage of the cell, to create a channel current that flows from drain region 116 to source region 114 if cell 100 has not been programmed, and insufficient, i.e., less than the threshold voltage of the cell, to create the channel current if cell 100 has been programmed. The logic state of cell 100 is then determined by comparing the magnitude of the channel current flowing into drain region 116 with a reference current.

EPROM cell 100 is erased by irradiating cell 100 with ultraviolet (UV) light to remove the electrons. The UV light increases the energy of the electrons which, in turn, allows the electrons to penetrate the surrounding layers of oxide.

One problem with single-poly EPROM cells that are embedded in CMOS logic and mixed-signal circuits is that the cells are not well suited for low-voltage and low-power applications. Thus, when the underlying circuitry is scaled down for low-power applications, single-poly EPROM cells still require high-voltage circuitry to provide the needed programming voltages.

In addition, the formation of channel hot electrons during the programming of a conventional single-poly EPROM cell draws a relatively large current for low-power applications. Thus, there is a need for a single-poly EPROM cell that operates in a low-voltage environment.

The invention of the parent application provided a single-poly EPROM cell that was programmable in a low-voltage environment. There still remains, however, a need for a single-poly electrically-erasable programmable read-only-memory (EEPROM) cell that can be both programmed and erased in a low-voltage environment.

SUMMARY OF THE INVENTION

Conventional single-poly EPROM cells utilize relatively high voltages, i.e., +12V, to program the cells. The present invention provides a single-poly EEPROM cell that is both programmable and erasable in a low-voltage environment, i.e., +3.3V.

The single-poly EEPROM cell of the present invention, which is formed in a semiconductor material of a first conductivity type, includes a first well of a second conductivity type which is formed in the semiconductor material, and a second well of the first conductivity type which is formed in the first well.

In addition, the single-poly EEPROM cell of the present invention also includes spaced-apart source and drain regions of the second conductivity type which are formed in the second well, and a channel region which is defined between the source and drain regions.

Further, the cell of the present invention also includes a base region of the second conductivity type which is formed in the second well, an isolation region which is formed in the second well to isolate the source region, the drain region, and the channel region from the base region.

In addition, spaced-apart first and second contact regions are formed in the base region so that the first contact region has the first conductivity type, and the second contact region has the second conductivity type.

Further, a lightly-doped region of the second conductivity type is formed in the semiconductor material to adjoin the first contact region, while a control gate region is defined between the lightly-doped region and the isolation region. The cell of the present invention additionally includes a layer of gate oxide formed over the channel region, a layer of tunnel oxide formed over the control gate region, and a floating gate formed over the gate oxide layer, the tunnel oxide layer, and a portion of the isolation region.

The cell of the present invention is programmed by applying a negative voltage, such as −3.3V, to the first contact region, a positive voltage, such as +3.3V, to the second contact region, and ground to the second well.

In operation, the programming bias voltages trigger band-to-band tunneling of charge carriers of the second conductivity type in the first contact region which, along with thermally generated carriers, are accelerated into having ionizing collisions that form hot charge carriers. The hot charge carriers, which are defined as majority carriers in the base region, then penetrate the tunnel oxide layer and accumulate on the floating gate.

The cell of the present invention is erased by applying a negative voltage, such as −3.3V, to the first contact region, the second contact region, and the second well. In addition, a second voltage, such as +Vcc or greater, is applied to the source region, while the drain is floated or grounded.

In operation, the erasing bias voltages cause charge carriers, which are defined as majority carriers in the base region, to flow away from the floating gate to the source region via Fowler-Nordheim tunneling.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 1A is a plan view of cell 100, FIG. 1B is a cross-sectional view taken along line 1B—1B of FIG. 1A, and FIG. 1C is a cross-sectional view taken along line 1C—1C of FIG. 1A.

FIG. 2A is a plan view of cell 200, FIG. 2B is a cross-sectional view taken along line 2B—2B of FIG. 2A, and FIG. 2C is a cross-sectional view taken along line 2C—2C of FIG. 2A.

FIG. 3A is a plan view of cell 300, FIG. 3B is a cross-sectional view taken along line 3B—3B of FIG. 3A, FIG. 3C is a cross-sectional view taken along line 3C—3C of FIG. 3A, and FIG. 3D is a cross-sectional view taken along line 3D—3D of FIG. 3A.

FIG. 4A is a plan view of cell 400, FIG. 4B is a cross-sectional view taken along line 4B—4B of FIG. 4A, and FIG. 4C is a cross-sectional view taken along line 4C—4C of FIG. 4A.

FIGS. 5–5D are a series of views illustrating a single-poly EPROM cell 500 in accordance with a third alternate embodiment of the parent invention. FIG. 5D is a cross-sectional view taken along line 5D—5D of FIG. 5A.

FIGS. 6–6D are a series of views illustrating a single-poly electrically-erasable programmable read-only-memory (EEPROM) cell 600 in accordance with the present invention. FIG. 6D shows a cross-sectional view taken along line 6D—6D of FIG. 6A.

DETAILED DESCRIPTION

Figure 2A:
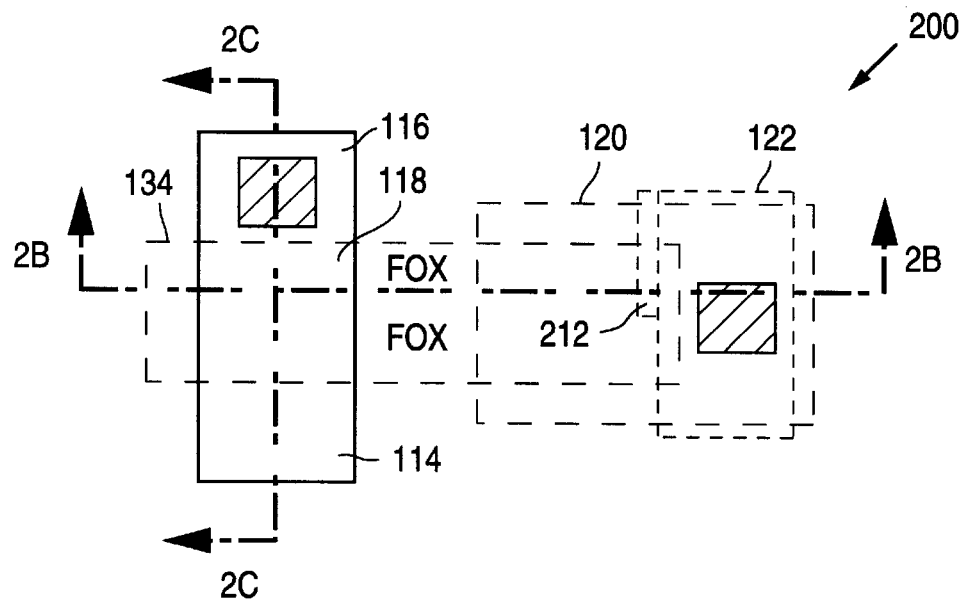
FIGS. 2A–2C are a series of views illustrating a single-poly EPROM cell 200 in accordance with the parent invention.
Figure 2B:
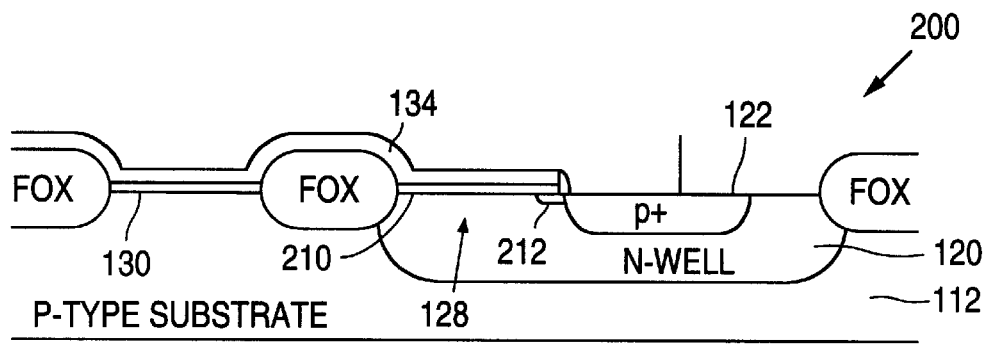
Figure 2C:
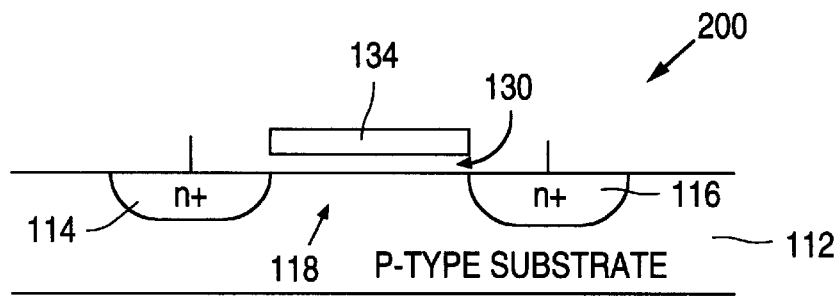

FIGS. 2A–2C show a series of views that illustrate a single-poly EPROM cell 200 in accordance with the parent invention. FIG. 2A shows a plan view of cell 200, FIG. 2B shows a cross-sectional view taken along line 2B—2B of FIG. 2A, while FIG. 2C shows a cross-sectional view taken along line 2C—2C of FIG. 2A.

As shown in FIGS. 2A–2C, EPROM cell 200 is structurally similar to EPROM cell 100 of FIG. 1 and, as a result, utilizes the same reference numerals to designate the structures which are common to both cells.

EPROM cell 200 principally differs from EPROM cell 100 in that EPROM cell 200 eliminates the need for n+ contact region 124. In addition, cell 200 also differs from cell 100 in that cell 200 utilizes a smaller PLDD region 212. As shown in FIG. 2A, the surface of p+ contact region 122 contacts both the surface of PLDD region 212 and the surface of n-well 120.

Further, cell 200 additionally utilizes a substantially thinner layer of tunnel oxide 210, e.g. approximately 70 Å thick in 0.5 micron technology and 55 Å thick in 0.35 micron technology, in lieu of the thicker layer of control gate oxide 132 utilized by cell 100, e.g., 120 Å and 70 Å thick, respectively. Alternately, oxide layers 132 and 210 can be formed to have substantially the same thickness.

As a result of utilizing a relatively thin layer of tunnel oxide, cell 200 provides an n-well to floating gate coupling ratio of approximately 0.8 or larger. In addition, due to the positioning of p+ contact region 122 with respect to floating gate 134, cell 200 also provides a very low p+ junction edge to floating gate coupling ratio of less than 0.05.

In operation, cell 200 is programmed by applying approximately −6 to −7 volts to p+ contact region 122, and grounding p-type material 112. In addition, both source and drain regions 114 and 116 are grounded or floated.

As a result, the potential of n-well 120 is clamped to approximately −0.5 volts which, in turn, slightly forward biases the p-type material 112 to n-well 120 junction, and reverse biases the n-well to p+ contact junction. (Although p+ contact region 122, n-well 120, and p-type material 112 form a parasitic bipolar transistor, the bipolar action is weak due to the low doping of p-type material 112). Further, since n-well 120 is near ground and the n-well to floating gate coupling ratio is approximately 0.8, the voltage on floating gate 134 is also close to ground.

Under these bias conditions, the vertical electric field across tunnel oxide layer 210 causes a depletion region to be formed in p+ contact region 122 and PLDD region 212 which, in turn, increases the potential at the surface of p+ contact region 122 and PLDD region 212.

In addition, the vertical electric field is also large enough to trigger band-to-band tunneling of electrons, which tunnel from the valence band to the conduction band, in p+ contact region 122 which then accumulate on the surface of p+ region 122. Although significant band-to-band tunneling does not occur in PLDD region 212, thermally-generated electrons accumulate on the surface of PLDD region 212.

The band-to-band electrons then drift into the depletion region of the reverse-biased n-well to p+ contact junction where the lateral electric field across the depletion region accelerates the electrons into having ionizing collisions that form band-to-band hot electrons.

In addition, thermally-generated electrons in the depletion region are also accelerated by the lateral electric field into having ionizing collisions that form thermal hot electrons. Both the band-to-band and thermal hot electrons initiate the avalanche process which produces many more hot electrons. The more positive potential of floating gate 134, with respect to p+ contact region 122 and PLDD region 212, attracts these hot electrons which penetrate tunnel oxide layer 210 and begin accumulating on floating gate 134.

Thus, by forming PLDD region 212 so that the surface of p+ contact region 122 contacts both the surface of PLDD region 212 and n-well 120, the band-to-band and thermal hot electrons are formed at the surface of control gate region 128 where tunneling is most likely to occur.

Alternately, PLDD region 212 can be formed so that the surface of p+ contact region 122 closest to control gate region 128 does not contact the surface of n-well 120. In this case, however, a lower injection efficiency is obtained because of the lower lateral electric field associated with the PLDD to n-well junction. In addition, hot electrons which are formed below the PLDD region at the p+ contact to n-well junction must pass through the PLDD region to penetrate tunnel oxide layer 210.

In addition to the formation of hot electrons, the band-to-band electrons at the surface of p+ contact region 122 and the thermally-generated electrons at the surface of PLDD region 212 are also injected onto floating gate 134 by means of Fowler-Nordheim tunneling.

For example, when −7 volts is applied to p+ contact region 122, the electric field across oxide layer 210 over PLDD region 212 is approximately 10.0 MV/cm assuming that tunnel oxide 210 is 70 Å thick. Slightly smaller electric fields are set up over p+ contact region 122. Higher oxide fields can be obtained by increasing the voltage applied to p+ contact region 122, or by reducing the thickness of tunnel oxide layer 210.

Cell 200 is read by applying approximately 5 volts to p+ contact region 122, and approximately 1–2 volts to drain region 116. In addition, both p-type material 112 and source region 114 are grounded.

When the positive voltage is applied to p+ contact region 122, a positive potential is induced on floating gate 134. Specifically, the positive voltage applied to p+ contact region 122 clamps the potential of n-well 120 to the voltage applied to p+ contact region 122 which, in conjunction with the potential of floating gate 134, forms a depletion region at the surface of control gate region 128 which reduces the potential at the surface of control gate region 128.

The positive voltage applied to p+ contact region 122 slightly forward-biases the PLDD region to n-well junction at the surface which, in turn, causes holes to be injected into the surface region of control gate region 128.

As with cell 100, the injected holes quickly (in picoseconds) reduce the depth of the depletion region at the surface of control gate region 128 which, in turn, places substantially all of the voltage applied to contact region 122 across tunnel oxide layer 210. Thus, the principal function of PLDD region 212 is as a source of holes when cell 200 is read.

Thus, when a read voltage is applied to p+ contact region 122, a positive potential is induced on floating gate 134 by the above-described mechanism which is sufficient to create a channel current that flows from drain region 116 to source region 114 if cell 200 has not been programmed, and insufficient to create the channel current if cell 200 has been programmed.

The logic state of cell 200 is then determined by comparing the magnitude of the current flowing into drain region 116 with a reference current. There will, however, be a somewhat larger leakage current in cell 200 at the p+ contact to n-well junction flowing from p+ contact region 122 to p-type material 112 due to the bipolar action of the parasitic bipolar transistor, i.e., p+ contact region 122, n-well 120, and p-type material 112 as emitter, base, and collector, respectively.

Thus, a single-poly EPROM cell has been disclosed which can be programmed with voltages that are approximately one-half (in magnitude) the voltages required by conventional single-poly EPROM cells, e.g., −6 to −7 volts versus +12 volts.

One of the principal advantages of the parent invention is that band-to-band tunneling induced hot electron injection is at least 100 times more efficient than the channel hot electron programming conventionally used to program single-poly EPROM cells.

Low power consumption is therefore achieved during programming of the parent invention by a combination of a lower magnitude bias voltage and a more efficient hot electron injection mechanism. In addition, by eliminating the n+ contact used in conventional single-poly EPROM cells, a substantially smaller cell layout is obtained.

Figure 3A:
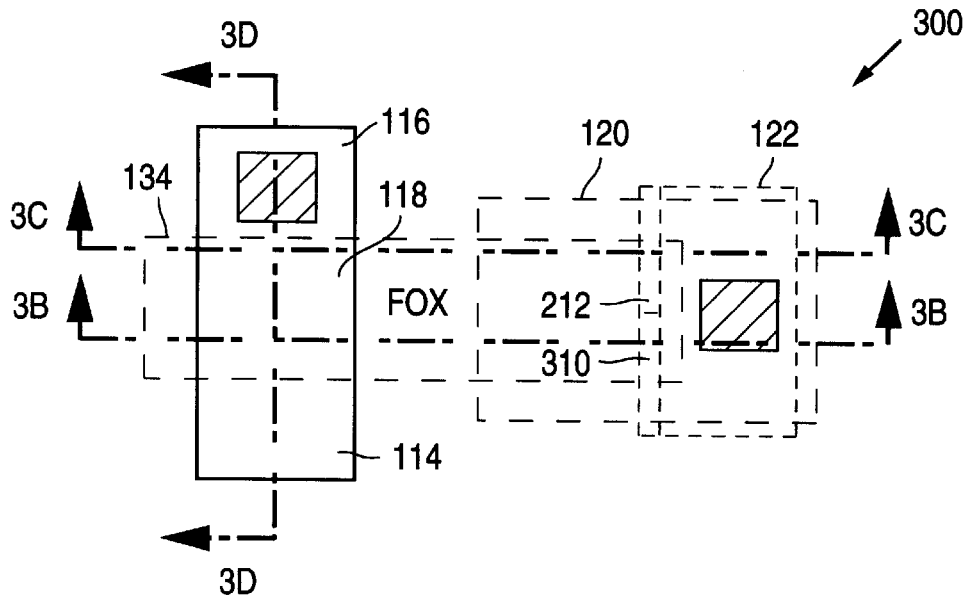
FIGS. 3A–3D are a series of views illustrating a single-poly EPROM cell 300 in accordance with a first alternate embodiment of the parent invention.
Figure 3B:
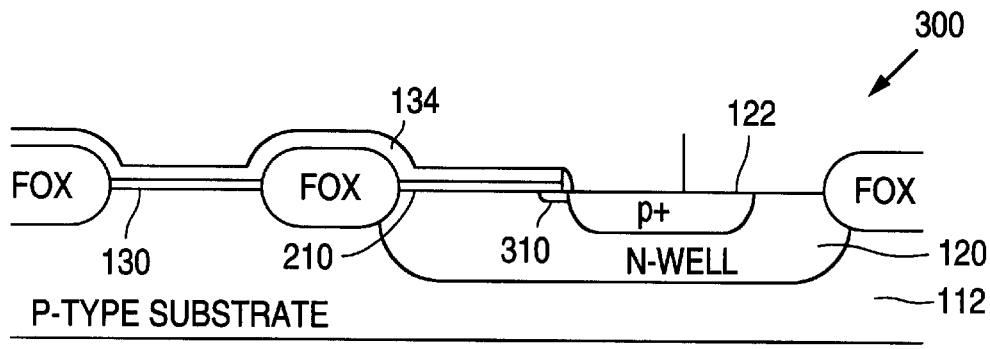
Figure 3C:
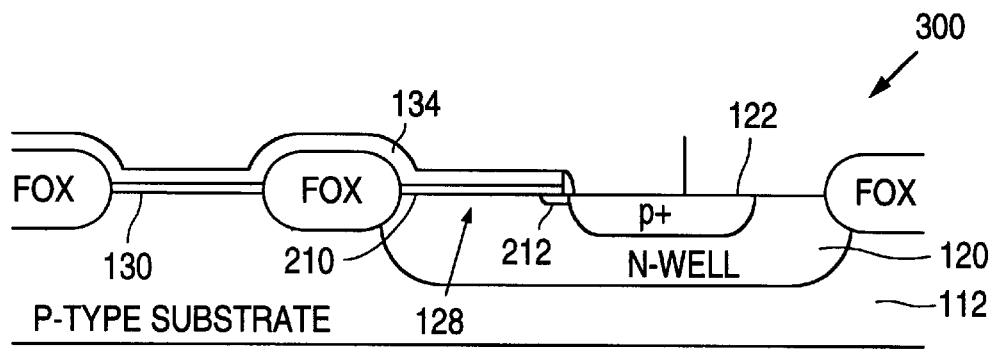
Figure 3D:
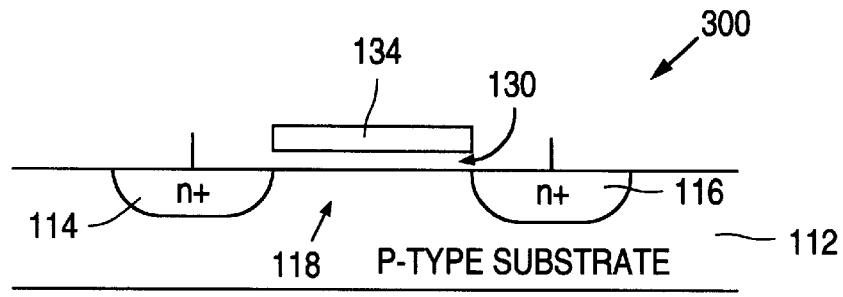

FIGS. 3A–3D show a series of views that illustrate a single-poly EPROM cell 300 in accordance with a first alternate embodiment of the parent invention. FIG. 3A shows a plan view of cell 300, FIG. 3B shows a cross-sectional view taken along line 3B—3B of FIG. 3A, FIG. 3C shows a cross-sectional view taken along line 3C—3C of FIG. 3A, and FIG. 3D shows a cross-sectional view taken along line 3D—3D of FIG. 3A.

As shown in FIGS. 3A–3D, EPROM cell 300 is structurally similar to EPROM cell 200 of FIGS. 2A–2C and, as a result, utilizes the same reference numerals to designate the structures which are common to both cells. EPROM cell 300 principally differs from EPROM cell 200 in that EPROM cell 300 also utilizes an NLDD region 310.

The operation of cell 300 is the same as the operation of cell 200 except that NLDD region 310 enhances the formation of hot electrons due to the larger lateral electric field that exists across the depletion region of the p+ contact to NLDD junction. As a result of the larger lateral electric field, cell 300 produces substantially more band-to-band tunneling induced and thermal hot electrons than does cell 200.

Figure 4A:
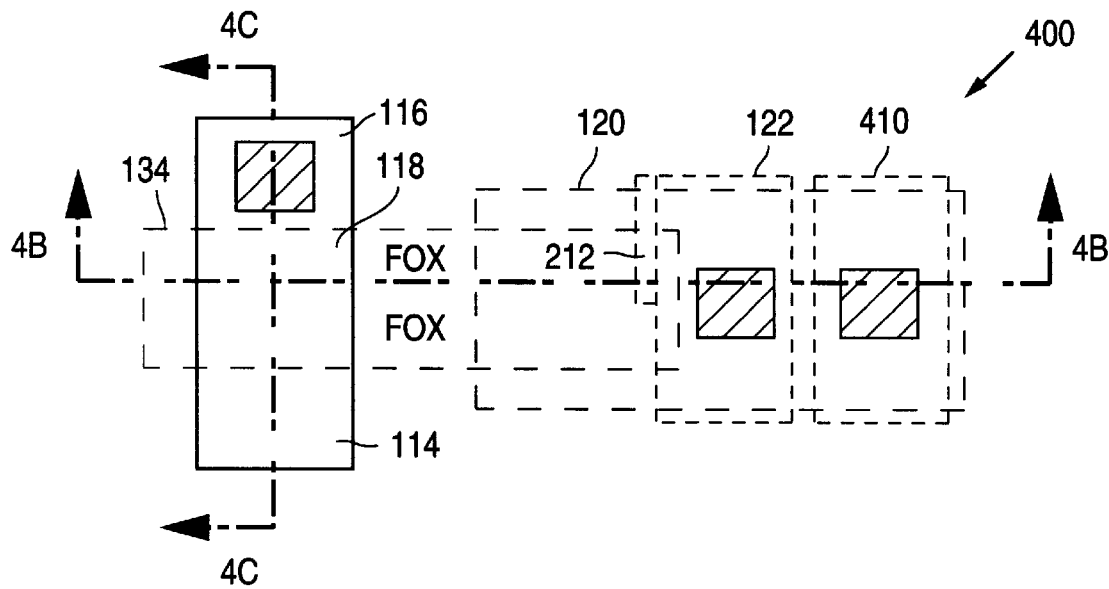
FIGS. 4A–4C are a series of views illustrating a single-poly EPROM cell 400 in accordance with a second alternate embodiment of the parent invention.
Figure 4B:
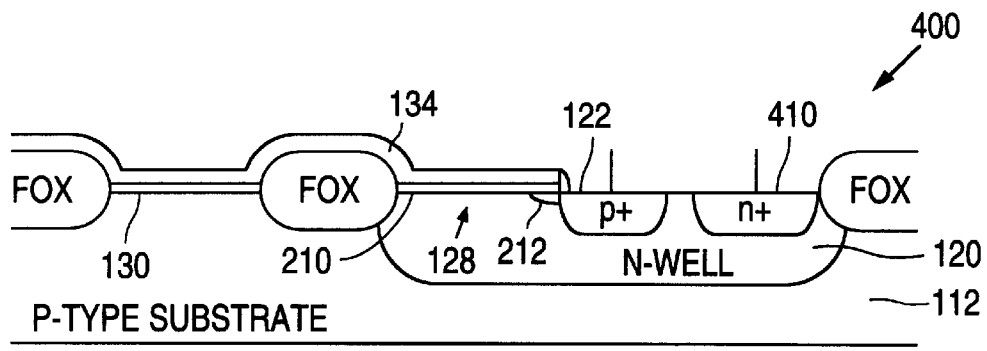
Figure 4C:
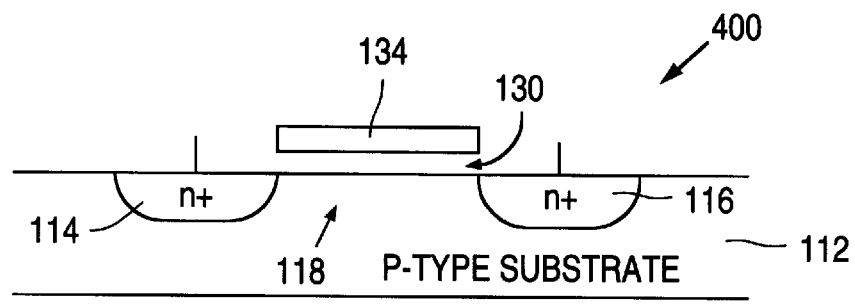

FIGS. 4A–4C show a series of views that illustrate a single-poly EPROM cell 400 in accordance with a second alternate embodiment of the parent invention. FIG. 4A shows a plan view of cell 400, FIG. 4B shows a cross-sectional view taken along line 4B—4B of FIG. 4A, while FIG. 4C shows a cross-sectional view taken along line 4C—4C of FIG. 4A.

As shown in FIGS. 4A–4C, EPROM cell 400 is structurally similar to EPROM cell 200 of FIGS. 2A–2C and, as a result, utilizes the same reference numerals to designate the structures which are common to both cells. EPROM cell 400 principally differs from EPROM cell 200 in that EPROM cell 400 also utilizes an n+ contact region 410 which, unlike conventional cells, is spaced apart from p+ contact region 122. Therefore, different biasing voltages can be separately applied to the p+ contact region 122 and the n+ contact region 410.

In operation, cell 400 is programmed by applying approximately −4 volts to p+ contact region 122, grounding p-type material 112, and applying approximately +4 volts to n+ contact region 410. In addition, both source and drain regions 114 and 116 are grounded or floated.

As a result, the voltage applied n+ contact region 410 is placed on n-well 120 which reverse-biases both the p-type material 112 to n-well 120 junction, and the n-well to p+ contact junction. Thus, cell 400 eliminates the parasitic bipolar transistor that existed within cells 200 and 300.

Further, since the potential on n-well 120 is approximately +4 volts and the n-well to floating gate coupling ratio is approximately 0.8 or larger, the potential on floating gate 134 is also close to +4 volts. Thus, substantially the same vertical electric field is formed in cell 400 by placing +4 volts on n+ contact region 410 and −4 volts on p+ contact region 122 as is formed in cell 200 by placing −6 to −7 volts on only p+ contact region 122.

Thus, the vertical electric field across tunnel oxide layer 210 of cell 400 also causes a depletion region to be formed in p+ contact region 122 and PLDD region 212 which increases the potential at the surfaces of p+ contact region 122 and PLDD region 212.

In addition, the vertical electric field is also large enough to trigger band-to-band tunneling of electrons in p+ contact region 122 of cell 400 which then accumulate on the surface of p+ region 122. As with cell 200, significant band-to-band tunneling does not occur in PLDD region 212, although thermally-generated electrons accumulate on the surface of PLDD region 212.

One significant difference between cell 400 and cell 200, however, is that cell 400 provides a substantially larger reverse bias across the p+ contact region to n-well junction by using smaller bias voltages with both positive and negative polarities.

Thus, when the band-to-band electrons drift into the depletion region of the reverse-biased n-well to p+ contact junction, the stronger lateral electric field of cell 400 accelerates the electrons into having more ionizing collisions that form more band-to-band hot electrons.

In addition, thermally-generated electrons in the depletion region of the reverse-biased n-well to p+ contact junction are also accelerated by the stronger lateral electric field into having more ionizing collisions that form more thermal hot electrons. Both the band-to-band and thermal hot electrons initiate the avalanche process which produces many more hot electrons. As with cell 200, the more positive potential of floating gate 134 attracts these band-to-band and thermal hot electrons which penetrate tunnel oxide layer 210 and begin accumulating on floating gate 134.

Further, as with cell 200, the band-to-band electrons at the surface of p+ contact region 122 and the thermally-generated electrons at the surface of PLDD region 212 are also injected onto floating gate 134 by means of Fowler-Nordheim tunneling.

Figure 1A:
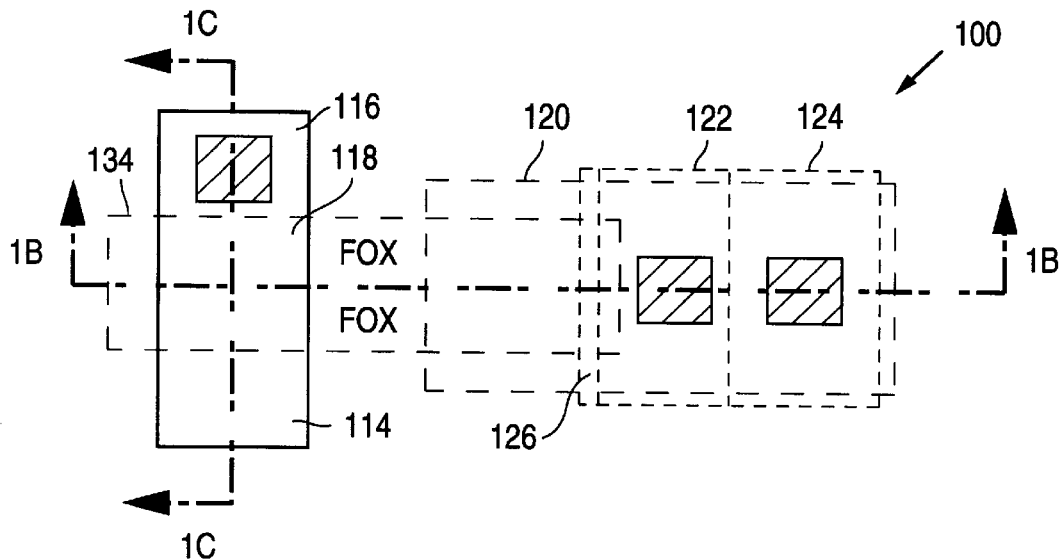
FIGS. 1A–1C are a series of views illustrating a conventional single-poly EPROM cell 100.
Figure 1B:
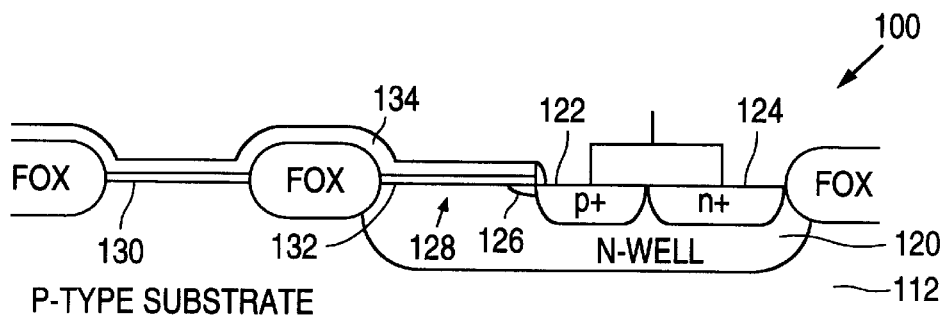
Figure 1C:
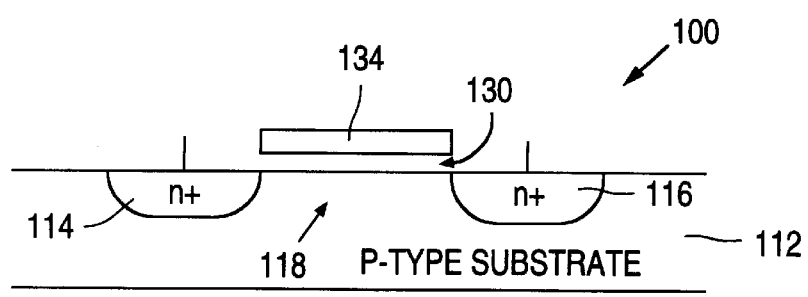

Cell 400 is read the same way as cell 100 of FIGS. 1A–1C or, alternately, can be read the same way that cell 200 of FIGS. 2A–2C is read. Thus, cell 400 can be read by placing the same voltage on p+ contact region 122 and n+ contact region 410, e.g., 5 volts, or by placing a positive voltage on p+ contact region 122, e.g., 5 volts, and floating n+ contact region 410 (while placing a positive voltage on drain region 116, e.g., 1 volt, and ground source region 114).

Figure 5A:
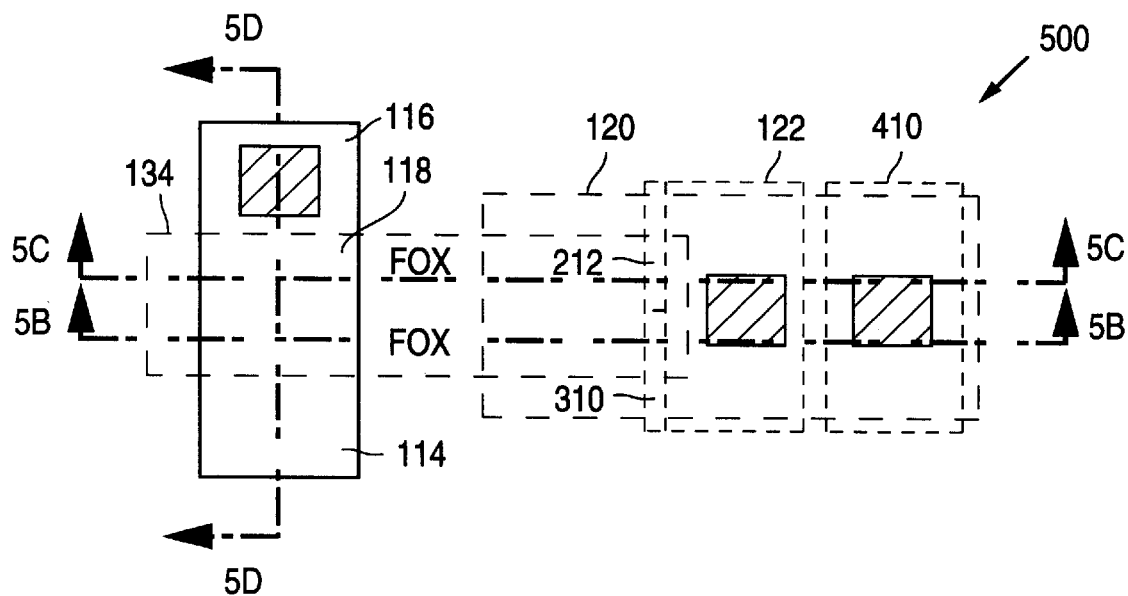
FIG. 5A is a plan view of cell 500.
Figure 5B:
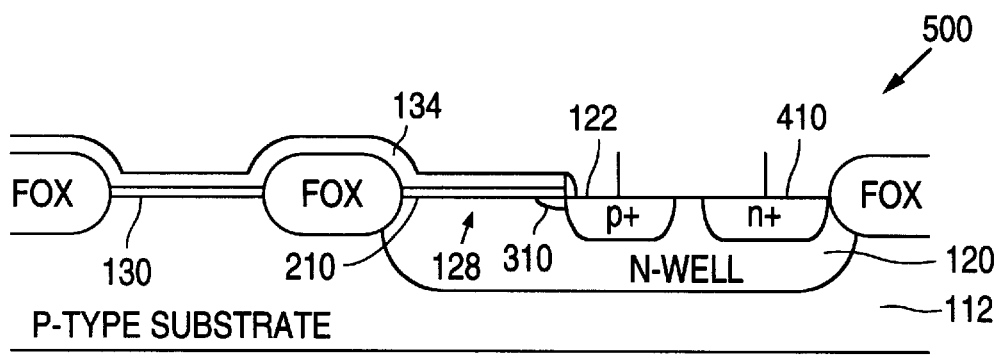
FIG. 5B is a cross-sectional view taken along line 5B—5B of FIG. 5A.
Figure 5C:
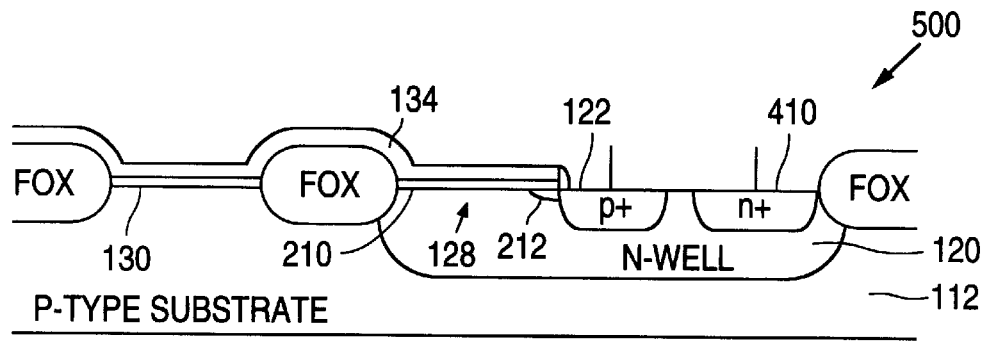
FIG. 5C is a cross-sectional view taken along line 5C—5C of FIG. 5A.
Figure 5D:
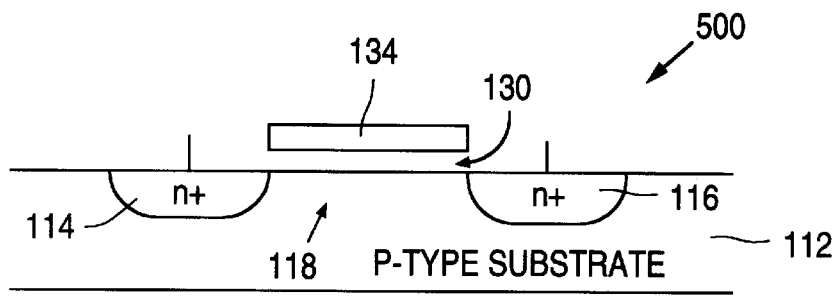

FIGS. 5A–5D show a series of views that illustrate a single-poly EPROM cell 500 in accordance with a third alternate embodiment of the parent invention. FIG. 5A shows a plan view of cell 500, FIG. 5B shows a cross-sectional view taken along line 5B—5B of FIG. 5A, FIG. 5C shows a cross-sectional view taken along line 5C—5C of FIG. 5A, while FIG. 5D shows a cross-sectional view taken along line 5D—5D of FIG. 5A.

As shown in FIGS. 5A–5D, EPROM cell 500 is structurally similar to EPROM cell 400 of FIGS. 4A–4C and, as a result, utilizes the same reference numerals to designate the structures which are common to both cells. EPROM cell 500 principally differs from EPROM cell 400 in that EPROM cell 500 also utilizes an NLDD region 510.

The operation of cell 500 is the same as the operation of cell 400 except that NLDD region 510 enhances the formation of hot electrons by further increasing the lateral electric field that exists across the depletion region of the p+ contact to NLDD and mixed-signal circuits. Recently, the trend with CMOS mixed-signal circuits has been to utilize a triple-well structure due to the higher noise isolation provided by the triple-well structure.

Figure 6A:
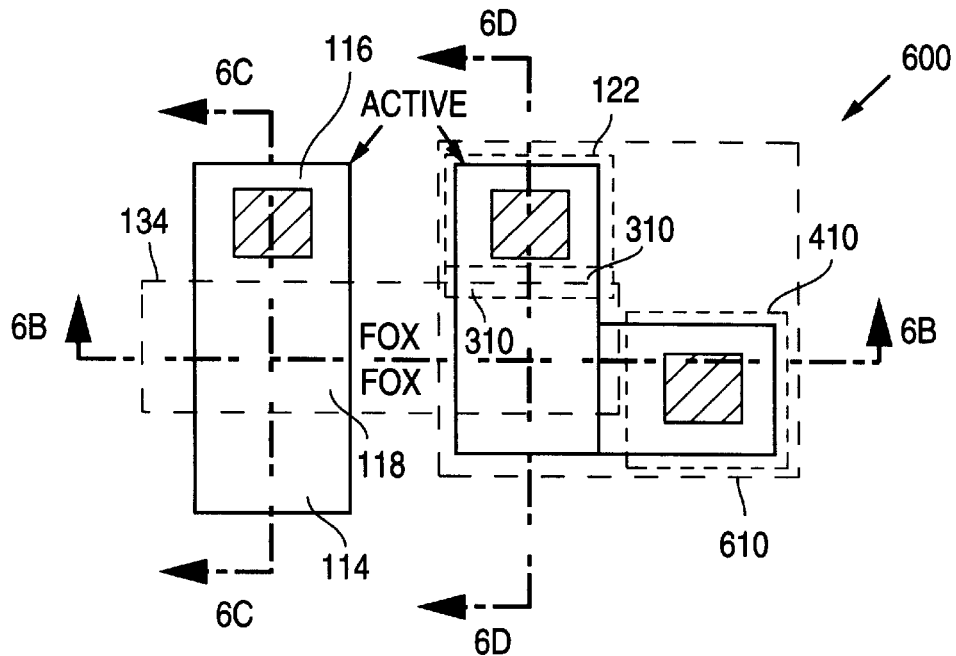
FIG. 6A shows a plan view of cell 600.
Figure 6B:
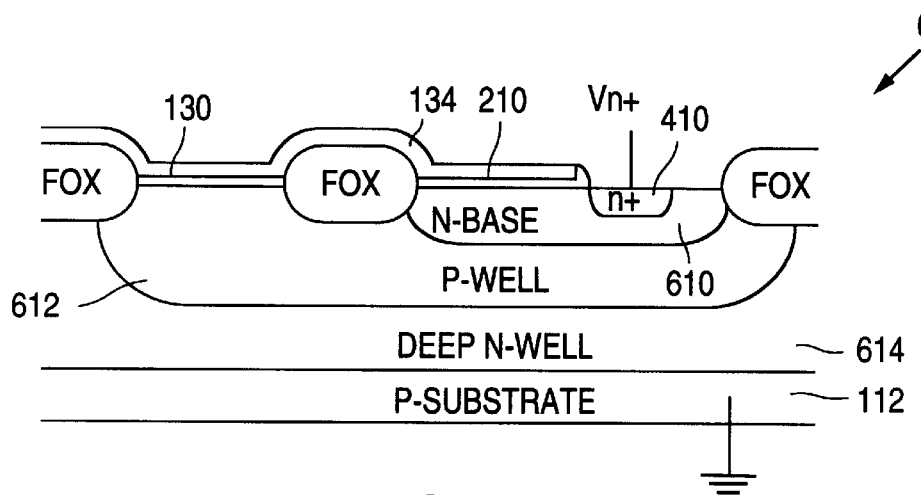
FIG. 6B shows a cross-sectional view taken along line 6B—6B of FIG. 6A.
Figure 6C:
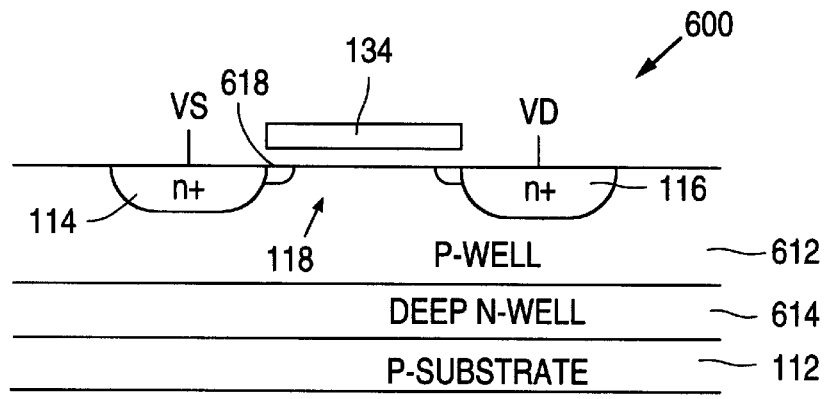
FIG. 6C shows a cross-sectional view taken along line 6C—6C of FIG. 6A.
Figure 6D:
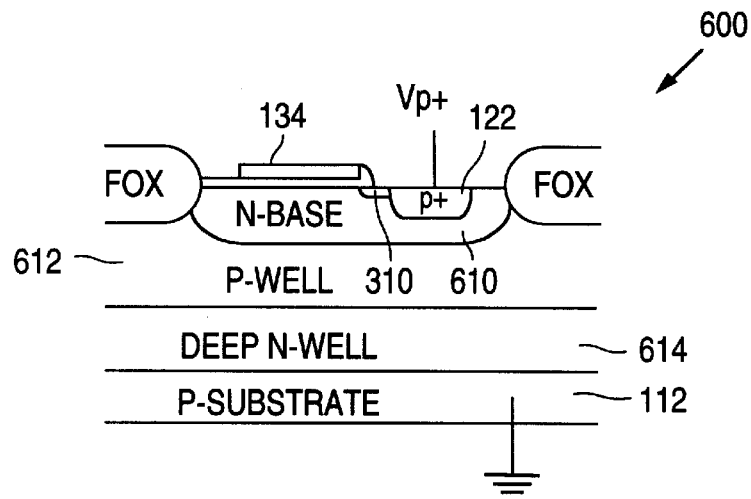

FIGS. 6A–6D show a series of views that illustrate a single-poly EEPROM cell 600 in accordance with the present invention. FIG. 6A shows a plan view of cell 600, FIG. 6B shows a cross-sectional view taken along line 6B—6B of FIG. 6A, FIG. 6C shows a cross-sectional view taken along line 6C—6C of FIG. 6A, while FIG. 6D shows a cross-sectional view taken along line 6D—6D of FIG. 6A.

As shown in FIGS. 6A–6D, EEPROM cell 600 is structurally similar to EPROM cell 400 of FIGS. 4A–4C and, as a result, utilizes the same reference numerals to designate the structures which are common to both cells.

EEPROM cell 600 principally differs from EPROM cell 400 in that cell 600 is formed in a triple-well structure, i.e., a shallower n-base region 610 is utilized in lieu of n-well 120; n-base region 610, source region 114, and drain region 116 are formed in a p-well 612 rather than directly in p-substrate 112; p-well 612 is formed in a deep n-well 614; and n-well 614 is formed in p-substrate 112.

Figure 7:
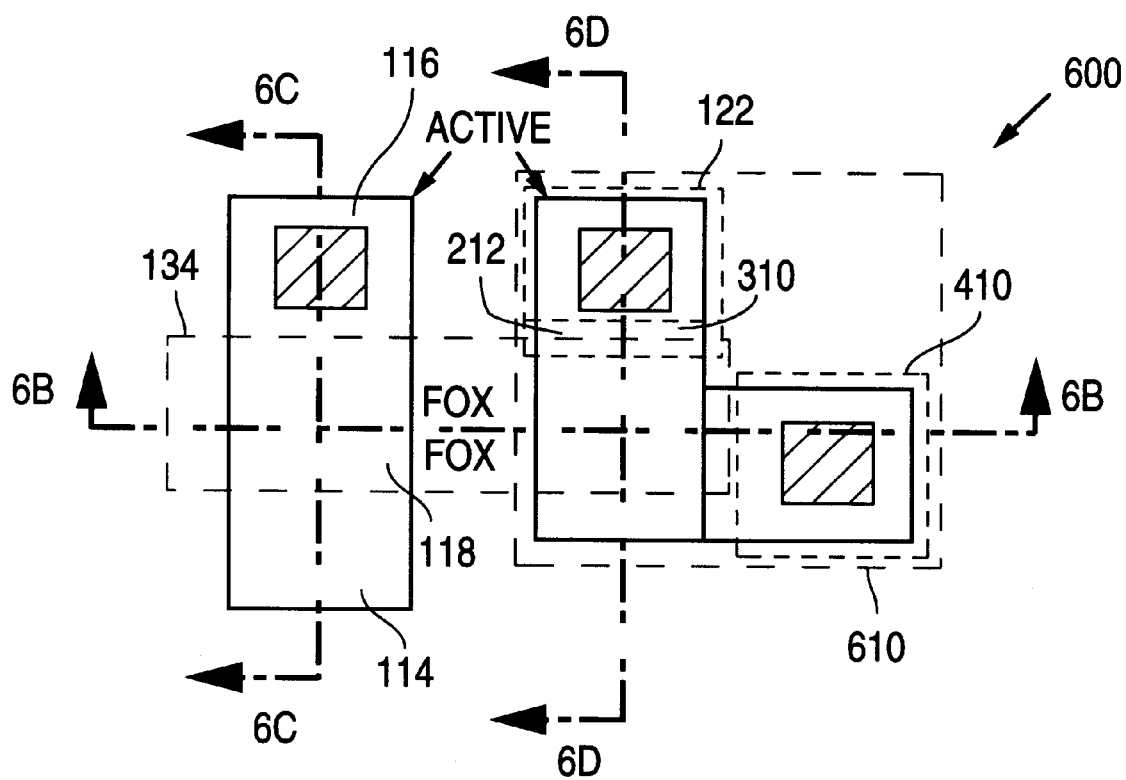
FIG. 7 shows a plan view of cell 600 in accordance with the present invention.

In addition, NLDD region 310 is formed adjacent to p+ contact region 122 (NLDD region 310 enhances the electric field for more efficient hot electron generation and injection). Further, PLDD region 212 may alternately be used with NLDD region 310 as shown in FIG. 7, or in lieu of NLDD region 310.

One of the advantages of the present invention is that cell 600 is fabricated by utilizing only one additional implant mask, which is required to form n-base 610, than is required for conventional triple-well CMOS processes. As a result, the doping concentration for n-base 610 may be independently set. (The doping concentration of n-well 120 in cells 200, 300, 400, and 500 may also be independently set with the use of an additional implant mask).

Alternately, if cell 600 is utilized in a mixed-signal circuit, then the same n-base implant mask can also be used to form vertical pnp bipolar devices. Thus, in mixed-signal circuits utilizing vertical pnp bipolar devices, cell 600 can be formed without any additional fabrication steps. (Even with mixed-signal circuits, the doping concentration for n-base 610 may be independently set with the use of an additional implant mask).

In operation, cell 600 is programmed by applying a negative supply voltage −Vcc to p+ contact region 122; grounding p-substrate 112, source region 114, drain region 116, and p-well 612; and applying a positive supply voltage Vcc to n+ contact region 410 and deep n-well 614. Source and drain regions 114 and 116 may alternately be floated.

The voltage applied to n+ contact region 410 is placed on n-base 610 which reverse-biases both the p-well to n-base junction, and the n-base to p+ contact junction. Thus, as with cells 400 and 500, cell 600 also eliminates the parasitic bipolar transistor of cells 200 and 300.

Further, the potential on n-base 610 is equal to the positive supply voltage Vcc and the n-base to floating gate coupling ratio is approximately 0.8. As a result, the potential on floating gate 134 is approximately 0.8Vcc. Thus, substantially the same vertical electric field is formed in cell 600 as is formed by cells 400 and 500.

As a result, the vertical electric field across tunnel oxide layer 210 of cell 600 also causes a depletion region to be formed in p+ contact region 122 which increases the potential at the surface of p+ contact region 122.

In addition, the vertical electric field is also large enough to trigger band-to-band tunneling of electrons in p+ contact region 122 of cell 600 which then accumulate on the surface of p+ region 122.

Thus, when the band-to-band electrons drift into the depletion region of the reverse-biased NLDD (via n-base) to p+ contact junction, the strong lateral electric field across the junction accelerates the electrons into having ionizing collisions that form band-to-band hot electrons.

In addition, thermally-generated electrons in the depletion region of the reverse-biased NLDD (n-base) to p+ contact junction are also accelerated by the strong lateral electric field across the junction into having ionizing collisions that form thermal hot electrons. Both the band-to-band and thermal hot electrons initiate the avalanche process which produces many more hot electrons. As with cells 400 and 500, the more positive potential of floating gate 134 attracts these hot electrons which penetrate tunnel oxide layer 210 and begin accumulating on floating gate 134.

Further, as with cells 400 and 500, the band-to-band electrons at the surface of p+ contact region 122 and the thermally-generated electrons at the surface of NLDD region 310 are also injected onto floating gate 134 by means of Fowler-Nordheim tunneling.

When formed in a NOR array, the program operation can be performed on a row of cells, or selected cells in a row. For example, if a plurality of cells 600 are arranged in a NOR array where each p+ contact region 122 in a column of p+ contact regions are electrically connected together, each n+ contact region 410 in a row of n+ contact regions are electrically connected together, each source region 114 in a row of source regions are electrically connected together, and each drain region 116 in a column of drain regions are electrically connected together, then selected cells 600 in a row of cells are simultaneously programmed by applying +Vcc to the n+ contact regions, and ground to the source regions, in the row; −Vcc to the p+ contact regions, and ground to the drain regions, that correspond with the columns of cells in the row that are to be programmed, and ground to p-well 612 (ground and +Vcc are always applied to substrate 112 and deep n-well 614, respectively). The unselected rows of the array, in turn, have ground applied to the n+ contact regions. As a result, program disturb is negligible.

Cell 600 is read by applying approximately 0.5 volts (for 0.35 micron technology devices) on drain region 116; grounding substrate 112, source region 114, p-well 612; and applying the power supply voltage +Vcc to deep n-well 614. Further, the power supply voltage +Vcc is also applied to either 1) both p+ and n+ contact regions 122 and 410 as with prior art cell 100, or 2) p+ contact region 122 (with n+ contact region 410) floating as with cell 400.

In addition, if the doping concentration of n-base 610 is increased over that which is used to form n-well 120 to, for example, approximately $1 \times 10^{19}$ to $1 \times 10^{20}$ atoms/cm$^3$, then cell 600 can also be read by applying the power supply voltage +Vcc to only n+ contact region 410, while applying approximately 0.5 volts to drain region 116; grounding substrate 112, source region 114, p-well 612; applying the power supply voltage +Vcc to deep n-well 614, and floating p+ contact region 122. (Alternately, a lower doping concentration can be used if n-base 610 is masked when boron is implanted to set the threshold voltages of the CMOS transistors).

When the doping concentration on the surface of n-base 610 is high, the surface continues to have electrons, or is only slightly depleted, when a read voltage is applied to only n+ contact region 410. As a result, the coupling ratio remains high.

As the dopant concentration on the surface of n-base 610 declines, however, the read voltage applied to only n+ contact region 410 will cause the depletion region to increase and, as discussed with respect to cell 100, eventually invert. As a result, a declining dopant concentration on the surface of n-base 610 causes a declining coupling ratio.

When formed in a NOR array, as described above, each of the cells 600 in a selected row of cells are simultaneously read by applying +Vcc to either 1) both p+ and n+ contact regions 122 and 410, 2) the p+ contact regions 122, or 3) the n+ contact regions (when a high surface dopant concentration is present) of each cell in the selected row of cells.

In addition, ground is applied to the source regions 114 of each cell in the selected row of cells; ground is applied to each of the p+ contact regions, and +0.5V to each of the drain regions 116, in each column in the selected row; and ground is applied to p-well 612.

The unselected rows of the array, in turn, float both n+ contact region 410 and source region 114 when Vcc is applied to both the p+ and n+ contact regions 122 and 410 in the selected row, float source region 114 when Vcc is applied to only p+ contact region 122 in the selected row, and apply ground to n+ contact region 410 and source region 114 when Vcc is applied to only the n+ contact region 410 in the selected row.

In accordance with the present invention, cell 600 is erased by edge Fowler-Nordheim tunneling by applying −Vcc to p+ contact region 122, n-base 610 (via n+ contact region 410), and p-well 612; applying +Vcc to deep n-well 614; grounding substrate 112; grounding or floating drain region 116; and applying a positive source voltage, such as +Vcc or greater, to source region 114 which is sufficient to induce Fowler-Nordheim tunneling from source 114 to floating gate 134.

As a result, the entire n-base and p-well are biased to approximately −3.3V, while the potential on floating gate 134 is close to −Vcc. (Considering the combined coupling from n-base 610 and p-well 612, approximately −3.3 would be present on the floating gate. Considering the net electrons on the floating gate lowers this voltage to a voltage which is even more negative than −Vcc.) Thus, in addition to the other erase bias voltages, a positive voltage of +Vcc or higher, which may be charge pumped, must be applied to source region 114 to induce edge Fowler-Nordheim tunneling in a 0.35 micron technology device.

For example, when cell 600 is fabricated with a 0.35 micron photolithographic process, and uses a Vcc voltage of 3.3 volts, and a source voltage of approximately +4 volts, a total voltage of approximately 7 volts or more is placed across gate oxide layer 130 which, in turn, is sufficient to induce Fowler-Nordheim tunneling.

As noted above, gate oxide layer 130 is thicker than control gate oxide layer 210 (approximately 70 Å thick for layer 130 compared to approximately 55 Å thick for layer 210). The thicker gate oxide layer 130 leads to a larger coupling ratio from the n-base to the floating gate, and a smaller coupling ratio from the source to the floating gate, as well as a smaller tunneling current (during erase) from the floating gate to the source edge (due to the thicker oxide).

In addition, the total voltage drop across the source junction is approximately −2Vcc, and should be lower than the breakdown voltage to minimize hot carrier generation. Thus, LDD structures 618 are utilized adjacent to the sources.

When formed in a NOR array, as described above, the erase operation can be performed on the entire array, a block of cells, or selected rows of the array. When erasing less than the entire array, the p+ and n+ contact regions 122 and 410 of the cells in the unselected rows are grounded.

It should be understood that various alternatives to the embodiment of the invention described herein may be employed in practicing the invention. For example, the present invention applies equally to 0.25 and 0.18 micron photolithographic process with the bias voltages scaled down accordingly.

Thus, it is intended that the following claims define the scope of the invention and that methods and structures within the scope of these claims and their equivalents be covered thereby.

What is claimed is:

1. A memory cell formed in a semiconductor material of a first conductivity type, the memory cell comprising:
   a first well of a second conductivity type formed in the semiconductor material;
   a second well of the first conductivity type formed in the first well;
   a source region of the second conductivity type formed in the second well;
   a drain region of the second conductivity type formed in the second well;
   a channel region defined between the source and drain regions;
   a base region of the second conductivity type formed in the second well, the base region having a surface;
   an isolation region formed in the second well to isolate the source region, the drain region, and the channel region from the base region;
   a first contact region of the first conductivity type formed in the base region, the first contact region having a surface;
   a second contact region of the second conductivity type formed in the base region, the second contact region being spaced apart from the first contact region;

a lightly-doped region of the second conductivity type formed to adjoin the first contact region so that the surface of the first contact region adjoins the surface of the base region and a surface of the lightly-doped region;

a control gate region defined between the lightly-doped region and the isolation region;

a layer of gate oxide formed over the channel region, the layer of gate oxide having a thickness;

a layer of tunnel oxide formed over the control gate region, the layer of tunnel oxide having a thickness; and a floating gate formed over the gate oxide layer, the tunnel oxide layer, and a portion of the isolation region.

2. The memory cell of claim 1 and further comprising a lightly-doped region of the first conductivity type formed to adjoin the first contact region.

3. The memory cell of claim 1 wherein the isolation region comprises a field oxide region.

4. A method for programming a memory cell formed in a semiconductor material of a first conductivity type, the memory cell comprising:

a first well of a second conductivity type formed in the semiconductor material;

a second well of the first conductivity type formed in the first well;

a source region of a second conductivity type formed in the second well;

a drain region of the second conductivity type formed in the second well;

a channel region defined between the source and drain regions;

a base region of the second conductivity type formed in the second well, the base region having a surface;

an isolation region formed in the second well to isolate the source region, the drain region, and the channel region from the base region;

a first contact region of the first conductivity type formed in the base region, the first contact region having a surface;

a second contact region of the second conductivity type formed in the base region, the second contact region being spaced apart from the first contact region;

a lightly-doped region of the second conductivity type formed to adjoin the first contact region so that the surface of the first contact region adjoins the surface of the base region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the step of applying programming bias voltages by:

applying a first voltage to the first contact region, the first voltage being negative;

applying a second voltage to the second contact region, the second voltage being more positive than the first voltage; and grounding the second well, the programming bias voltages causing charge carriers, defined as majority carriers in the base region, to accumulate on the floating gate.

5. The method of claim 4 and further comprising the step of grounding the source and drain regions.

6. The method of claim 4 and further comprising the step of floating the source and drain regions.

7. The method of claim 4 wherein the second voltage is positive.

8. The method of claim 4 wherein the substrate material is connected to ground, and the first well is connected to the second voltage.

9. A method for erasing a memory cell formed in a semiconductor material of a first conductivity type, the memory cell comprising:

a first well of a second conductivity type formed in the semiconductor material;

a second well of the first conductivity type formed in the first well;

a source region of a second conductivity type formed in the second well;

a drain region of the second conductivity type formed in the second well;

a channel region defined between the source and drain regions;

a base region of the second conductivity type formed in the second well, the base region having a surface;

an isolation region formed in the second well to isolate the source region, the drain region, and the channel region from the base region;

a first contact region of the first conductivity type formed in the base region, the first contact region having a surface;

a second contact region of the second conductivity type formed in the base region, the second contact region being spaced apart from the first contact region;

a lightly-doped region of the second conductivity type formed to adjoin the first contact region so that the surface of the first contact region adjoins the surface of the base region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the step of applying erasing bias voltages by:

applying a first voltage to the first contact region;

applying the first voltage to the second contact region;

applying the first voltage to the second well; and applying a second voltage to the source region, the second voltage being more positive than the first voltage;

the erasing bias voltages causing charge carriers, defined as majority carriers in the base region, to flow away from the floating gate.

10. The method of claim 9 and further comprising the step of grounding the drain region.

11. The method of claim 9 and further comprising the step of floating the drain region.

12. The method of claim 9 wherein the second voltage is positive.

13. The method of claim 9 wherein the substrate material is connected to ground, and the first well is connected to a third voltage, the third voltage being more positive than the first voltage.

14. A method for reading a memory cell formed in a semiconductor material of a first conductivity type, the memory cell comprising:

a first well of a second conductivity type formed in the semiconductor material;

a second well of the first conductivity type formed in the first well;

a source region of a second conductivity type formed in the second well;

a drain region of the second conductivity type formed in the second well;

a channel region defined between the source and drain regions;

a base region of the second conductivity type formed in the second well, the base region having a surface;

an isolation region formed in the second well to isolate the source region, the drain region, and the channel region from the base region;

a first contact region of the first conductivity type formed in the base region, the first contact region having a surface;

a second contact region of the second conductivity type formed in the base region, the second contact region being spaced apart from the first contact region;

a lightly-doped region of the second conductivity type formed to adjoin the first contact region so that the surface of the first contact region adjoins the surface of the base region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the step of applying reading bias voltages by:

applying a first voltage to the first contact region;

floating the second contact region;

applying a third voltage to the second well;

applying a fourth voltage to the drain region; and applying the third voltage to the source region, the reading bias voltages causing a current to flow from the drain region to the source region when the cell is unprogrammed.

15. A method for reading a memory cell formed in a semiconductor material of a first conductivity type, the memory cell comprising:

a first well of a second conductivity type formed in the semiconductor material;

a second well of the first conductivity type formed in the first well;

a source region of a second conductivity type formed in the second well;

a drain region of the second conductivity type formed in the second well;

a channel region defined between the source and drain regions;

a base region of the second conductivity type formed in the second well, the base region having a surface;

an isolation region formed in the second well to isolate the source region, the drain region, and the channel region from the base region;

a first contact region of the first conductivity type formed in the base region, the first contact region having a surface;

a second contact region of the second conductivity type formed in the base region, the second contact region being spaced apart from the first contact region;

a lightly-doped region of the second conductivity type formed to adjoin the first contact region so that the surface of the first contact region adjoins the surface of the base region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the step of applying reading bias voltages by:

floating the first contact region;

applying a first voltage to the second contact region;

applying a third voltage to the second well;

applying a fourth voltage to the drain region; and applying the third voltage to the source region, the reading bias voltages causing a current to flow from the drain region to the source region when the cell is unprogrammed.

16. A method for reading a memory cell formed in a semiconductor material of a first conductivity type, the memory cell comprising:

a first well of a second conductivity type formed in the semiconductor material;

a second well of the first conductivity type formed in the first well;

a source region of a second conductivity type formed in the second well;

a drain region of the second conductivity type formed in the second well;

a channel region defined between the source and drain regions;

a base region of the second conductivity type formed in the second well, the base region having a surface;

an isolation region formed in the second well to isolate the source region, the drain region, and the channel region from the base region;

a first contact region of the first conductivity type formed in the base region, the first contact region having a surface;

a second contact region of the second conductivity type formed in the base region, the second contact region being spaced apart from the first contact region;

a lightly-doped region of the second conductivity type formed to adjoin the first contact region so that the surface of the first contact region adjoins the surface of the base region and a surface of the lightly-doped region;

a control gate region defined between the lightly-doped region the isolation region;

a layer of gate oxide formed over the channel region;

a layer of tunnel oxide formed over the control gate region; and a floating gate formed over the gate oxide layer, the tunnel oxide layer, and a portion of the isolation region, the method comprising the step of applying reading bias voltages by:

applying a first voltage to the first contact region;

applying the first voltage to the second contact region;

applying a third voltage to the second well;

applying a fourth voltage to the drain region; and applying the third voltage to the source region, the reading bias voltages causing a current to flow from the drain region to the source region when the cell is unprogrammed.

17. The memory cell of claim 1 wherein the thickness of the tunnel oxide layer is substantially thinner than the thickness of the gate oxide layer.

* * * * *